United States Patent
Komiak et al.

(10) Patent No.: US 10,193,511 B2
(45) Date of Patent: Jan. 29, 2019

(54) MONOLITHIC MICROWAVE INTEGRATED CIRCUIT HAVING AN OVERLAY TRANSFORMER AND LOW IMPEDANCE TRANSMISSION LINES

(71) Applicant: BAE SYSTEMS INFORMATION AND ELECTRONIC SYSTEMS INTEGRATION INC., Nashua, NH (US)

(72) Inventors: James J. Komiak, Merrimack, NH (US); Cheryl V. Liss, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 120 days.

(21) Appl. No.: 15/391,930

(22) Filed: Dec. 28, 2016

(65) Prior Publication Data
US 2018/0183396 A1  Jun. 28, 2018

(51) Int. Cl.
| | |
|---|---|
| H03F 3/60 | (2006.01) |
| H01F 19/04 | (2006.01) |
| H01L 27/02 | (2006.01) |
| H03F 3/213 | (2006.01) |
| H03F 1/56 | (2006.01) |
| H01L 23/66 | (2006.01) |
| H03F 3/195 | (2006.01) |
| H01F 27/28 | (2006.01) |

(52) U.S. Cl.
CPC ............... *H03F 3/60* (2013.01); *H01F 19/04* (2013.01); *H01F 27/2804* (2013.01); *H01L 23/66* (2013.01); *H01L 27/0207* (2013.01); *H03F 1/56* (2013.01); *H03F 3/195* (2013.01); *H03F 3/213* (2013.01); *H03F 2200/255* (2013.01); *H03F 2200/423* (2013.01); *H03F 2200/451* (2013.01)

(58) Field of Classification Search
None
See application file for complete search history.

(56) References Cited

U.S. PATENT DOCUMENTS 8,988,161 B2  3/2015  Campbell

OTHER PUBLICATIONS

M. Ehrenfried, "The Design of Ruthroff Broadband Voltage Transformers," http://g8jnj.webs.com/Balun%20construction.pdf.

*Primary Examiner* — Patricia T Nguyen
(74) *Attorney, Agent, or Firm* — Sand & Sebolt, LPA; Scott J. Asmus (57) ABSTRACT

A monolithic microwave integrate circuit (MMIC) presents as a power amplifier including a 9:1 overlay transformer and artificial low impedance transmission lines. The 9:1 overlay transformer effects the output impedance thereof. The artificial low impedance transmission lines behave as inductors without occupying an amount of space equivalent to that of an inductor having similar properties as the artificial low impedance transmission line.

11 Claims, 7 Drawing Sheets

FIG. 7

MONOLITHIC MICROWAVE INTEGRATED CIRCUIT HAVING AN OVERLAY TRANSFORMER AND LOW IMPEDANCE TRANSMISSION LINES

BACKGROUND

Technical Field

The present disclosure relates generally to the field of circuits. More particularly, the present disclosure relates to transformers. Specifically, the present disclosure relates to monolithic microwave integrated circuit having an overlay transformer and artificial low impedance transmission lines.

Background Information

As indicated in U.S. Pat. No. 8,988,161 (the '161 patent), wideband distributed power amplifiers are used in many electronic communication systems. Typically, wideband distributed power amplifiers include a plurality of transistors with a first electrical path connecting the inputs of the transistors and the second electrical path connecting the outputs of the transistors. The first and second electrical paths include characteristic impedances between the inputs and outputs, respectively, of the transistors. However, the total useable transistor periphery of the distributed power amplifier is limited by the load impedance.

The '161 patent discloses side coupled microstrip transmission lines. To the extent that the '161 patent discusses overlay transmission lines (i.e., transmission lines that are broadside-coupled), the inventors of the '161 patent believe them to be difficult to implement (see Col. 3, ll. 36-49). The transmission lines of the '161 patent are quasi-TEM but do not have nomenclature associated with them. As such, the transmission lines of the '161 patent behave somewhat like asymmetrical stripline, but is limited to a 4:1 ratio of output impedance to input impedance.

SUMMARY

In one aspect, an embodiment of the present disclosure may provide a monolithic microwave integrated circuit (MMIC) power amplifier comprising: a substrate; an input port connected to the substrate and an output port connected to the substrate, defining an electrical current flow direction from the input port to the output port; a first overlay transformer supported by the substrate and electrically intermediate the input port and the output port for transforming impedance from a higher input impedance to a lower output impedance; a first artificial low impedance transmission line supported by the substrate that is electrically intermediate the input port and the output port, and in electrical communication with the first overlay transformer, wherein the first artificial low impedance transmission line includes at least one shunt capacitor and at least one high impedance transmission line arranged performing as an inductor to provide artificial low impedance to electrical signals flowing as current through the first artificial low impedance transmission line. An embodiment may further provide wherein the first overlay transformer is positioned up-current from the first artificial low impedance transmission line. An embodiment may further provide a second artificial low impedance transmission line supported by the substrate that is electrically intermediate the input port and the output port and positioned down-current from the first artificial low impedance transmission line for performing as an inductor to provide artificial low impedance to electrical signals flowing as current through the second artificial low impedance transmission line; and a third artificial low impedance transmission line supported by the substrate that is electrically intermediate the input port and the output port and positioned down-current from the first artificial low impedance transmission line for performing as an inductor to provide artificial low impedance to electrical signals flowing as current through the second low impedance transmission line. An embodiment may further provide wherein the second artificial low impedance transmission line is electrically connected parallel with the third artificial low impedance transmission line. An embodiment may further provide a second overlay transformer supported by the substrate and electrically intermediate the input port and the output port for transforming impedance from a higher input impedance to a lower output impedance; wherein the second overlay transformer is electrically down-current from the second artificial low impedance transmission line and the third artificial low impedance transmission line. An embodiment may further provide a first ratio of the higher input impedance to the lower output impedance of the first overlay transformer of 9:1; and a second ratio of the higher input impedance to the lower output impedance of the second overlay transformer of 9:1.

In another aspect, an embodiment of the present disclosure may provide an overlay transformer comprising: an input port and an output port, wherein electrical current flow from the input port to the output port; a first transmission line intermediate the input port and the output port; a second transmission line intermediate the input port and the output port; a couple electrically connecting an up-current end of the first transmission line with the second transmission line, wherein the second transmission line is backwards coupled relative to the first transmission line, and the second transmission line is connected to ground opposite the couple; a third transmission line intermediate the input port and the output port and electrically connected serially down-current with the first transmission line; a ratio of input impedance at the input port to output impedance at the output port of 9:1. An embodiment may further provide wherein: the first transmission line comprises: a first edge opposite a second edge, and a first broadside surface opposite a second broadside surface; the second transmission line comprises: a third edge opposite a fourth edge, and a third broadside surface opposite a fourth broadside surface; wherein the first broadside surface is vertically aligned with the third broadside surface. An embodiment may further provide wherein the third broadside surface is vertically directly above the first broadside surface. An embodiment may further provide wherein the third transmission line comprises: a fifth edge opposite a sixth edge, and a fifth broadside surface opposite a sixth broadside surface; wherein third transmission line overlays the second transmission line, and the second transmission line overlays the first transmission line such that the first broadside surface, the third broadside surface, and the fifth broadside surface are aligned directly vertical.

In another aspect, an embodiment of the present disclosure may provide an artificial low impedance transmission line comprising: a device input and a device output having current flow from the device input to the device output; a first shunt capacitor, a second shunt capacitor, and a third capacitor, wherein each capacitor respectively has a capacitor input and a capacitor output; a first inductor and a second inductor, wherein each inductor respectively has an inductor input and an inductor output; wherein the first capacitor input is electrically coupled intermediate the device input and the first inductor input, and the first capacitor output is coupled to ground; wherein the second capacitor input is electrically coupled intermediate the first inductor output and the second inductor input, and the second capacitor output is coupled to ground; and wherein the third capacitor input is electrically coupled intermediate the second inductor output and the device output, and the third capacitor output is coupled to ground; wherein the artificial low impedance transmission line is adapted to perform as a low impedance transmission line in a reduced space less than 1 mm wide and less than 20 mm long. One embodiment provides for a 0.1 mm width of the artificially low impedance transmission line. An embodiment may further provide wherein the first shunt capacitor, the second shunt capacitor, and the third capacitor are identical. An embodiment may further provide wherein the first inductor and the second inductor are identical.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
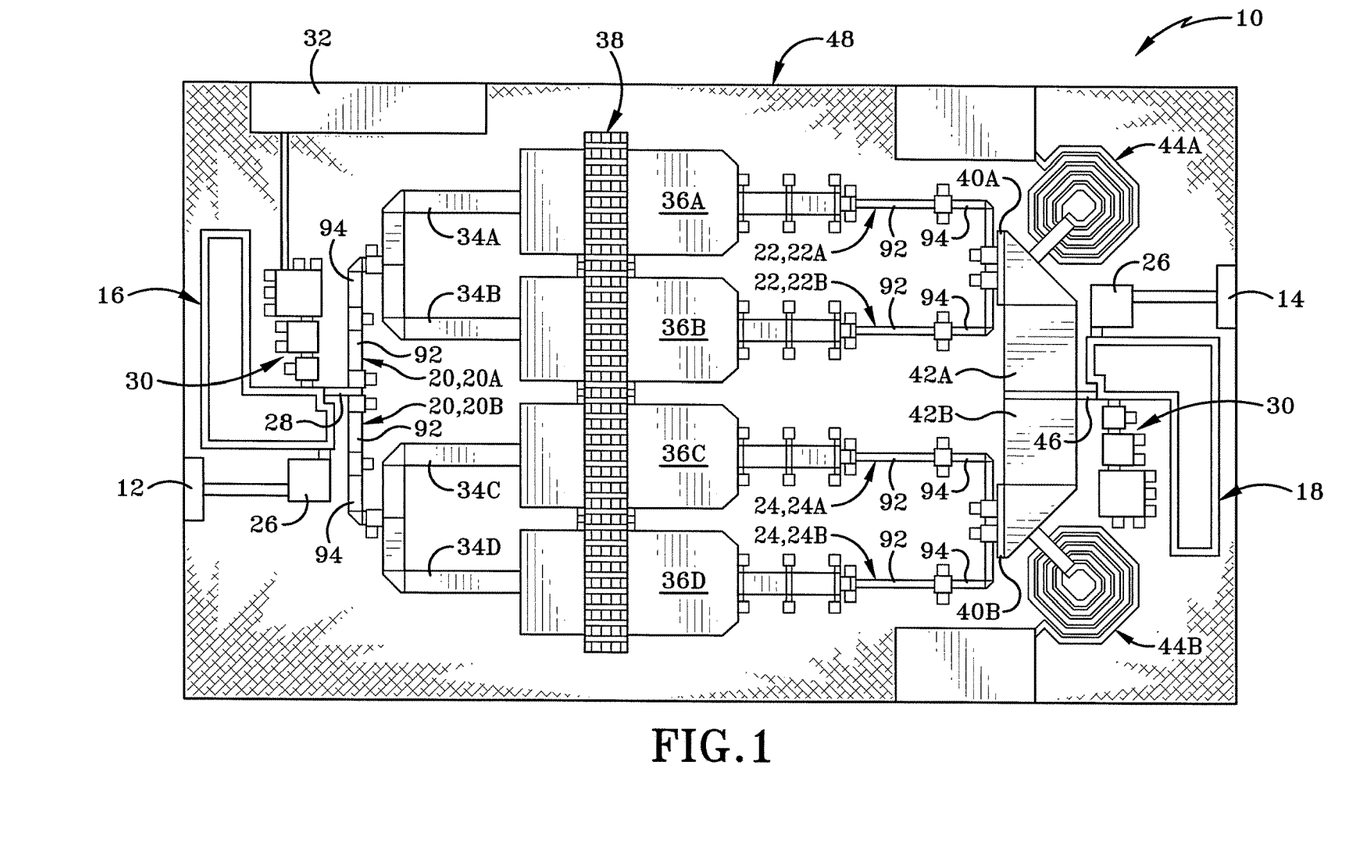
FIG. 1 is a diagrammatic top view of an integrated circuit layout in accordance with the present disclosure.

FIG. 1 depicts a Monolithic Microwave Integrated Circuit (MMIC), implemented as a Power Amplifier (PA), shown generally at 10. MMIC 10 may include at least one overlay transformer and at least one artificial low impedance transmission line. In one exemplary embodiment, the MMIC 10 may include some of the following components: an input port 12 (which may referred to simply as input 12), an output port 14 (which may be referred to simply as output 14), a first overlay transformer 16, a second overlay transformer 18, a first artificial low impedance transmission line 20, a second artificial low impedance transmission line 22, and a third artificial low impedance transmission line 24.

With continued reference to FIG. 1, input 12 is electrically connected to output 14 such that electrical signals move from the input towards the output defining a current flow stream therethrough. As understood in the art, when describing the current flow stream from the input 12 towards the output 14, components on MMIC 10 may be described as up-current or down-current relative to other components along the current flow stream moving between input 12 and output 14.

The first overlay transformer 16 is positioned electrically down-current from the input 12 and electrically up-current from the first artificial low impedance transmission line 20. As will be described in greater detail below, the first overlay transformer 16 includes an input, an output, and a ground. The input of the first overlay transformer 16 is electrically connected to a DC blocking capacitor or cap 26 and the output of the first overlay transformer 16 is electrically connected to the input of the first artificial low impedance transmission line 20. The connection of the output of the first overlay transformer 16 with the input of the first artificial low impedance transmission line 20 is shown generally at 28. The ground of the first overlay transformer 16 is connected with NC capacitors 30 which extend to ground 32.

From connection 28, the first artificial low impedance transmission line 20 splits into first and second sections 20A, 20B. First section 20A of first artificial low impedance transmission line 20 extends down-current towards an outlet connected with first transmission line 34A and second transmission line 34B. The second section 20B of artificial low impedance transmission line 20 extends electrically down-current in parallel with first section 20A towards an outlet. The outlet of second section 20B is connected with third transmission line 34C and fourth transmission line 34D. Third transmission line 34C is electrically parallel with fourth transmission line 34D.

A first wide transmission line 36A is serially connected electrically down-current from transmission line 34A. A second wide transmission line 36B is serially connected electrically down-current from transmission line 34B. A third wide transmission line 36C is serially connected electrically down-current from third transmission line 34C. A fourth wide transmission line 36D is serially connected electrically down-current from fourth transmission line 34D.

A power transistor 38 is electrically connected over the first-fourth wide transmission lines 36A-36D. As such, the power transistor 38 is positioned electrically down-current from the first artificial impedance transmission line 20 and up-current from the second artificial low impedance transmission line 22 and up-current from the third artificial low impedance line 24.

The wide transmission lines 36A-36D have a low impedance as a result of being very wide (for example, very wide may refer to approximately 1 mm or greater). Artificial low impedance transmission lines allow realization of similar impedances with very long (for example, very long may refer to 10 mm to 20 mm) dimensions. The outputs of the first wide transmission line 36A and the output of the second wide transmission line 36B are connected with the second artificial low impedance transmission line 22. Particularly, a first section 22A of the second artificial low impedance transmission line 22 is connected with the output of the first wide transmission line 36A. A second section 22B of the second artificial low impedance transmission line 22 is connected with the output of the second wide transmission line 36B. Accordingly, electrical signals (i.e., current) flow serially along transmission line 34A, first wide transmission line 36A, and first section 22A of the second artificial low impedance transmission line 22. Additionally, electrical signals (i.e., current) move serially along transmission line 34B, second wide transmission line 36B, and second section 22B of second artificial low impedance transmission line 22. The first section 22A and the second section 22B of the second artificial low impedance transmission line 22 meet at a connection 40 with a wide transmission line 42A. The wide transmission line 42A is additionally connected with an inductor 44A configured to introduce drain bias.

A first section 24A of third artificial low impedance transmission line 24 is connected down-current with an output of the third wide transmission line 36C. A second section 24B of the third artificial low impedance transmission line 24 is serially connected down-current with the output of fourth wide transmission line 36D. As such, transmission line 34C, third wide transmission line 36C, and first section 24A of third artificial low impedance transmission line 24 are electrically connected in a serial manner. Additionally, transmission line 34D, fourth wide transmission line 36D, and second section 24B of third artificial low impedance transmission line 24 are electrically connected serially. First section 24A and second section 24B meet at a connection 40B with a wide transmission line 42B. Wide transmission line 42B is further coupled with a second inductor 44B configured to introduce drain bias. The wide transmission lines 42A, 42B join at their outputs at a connection 46. The connection 46 is connected up-current with an input of the second overlay transformer 18.

The second overlay transformer 18 is down-current from the second transmission line 22 and the third transmission line 24. Transformer 18 includes an input, an output, and a ground, as will be described in greater detail below. As indicated previously, the input of the second overlay transformer 18 is connected at connection 46 with wide transmission lines 42, 42B. The ground of second overlay transformer 18 is connected with A/C capacitors 30. The output of the second overlay transformer 18 is electrically connected with output 14 having a DC blocking capacitor 26 positioned therebetween.

The above-referenced electrical components MMIC 10 are physically supported by a substrate 48. Substrate 48 may be fabricated from conventionally known materials utilized in MMICs. However, the substrate 48 typically has size constraints that are physically limited by the width and length of the actual substrate 48. Thus, utilization of first overlay transformer 16, second overlay transformer 18, the first artificial low impedance transmission line 20, the second artificial low impedance transmission line 22, and the third artificial low impedance transmission line 24 are arranged in the above described manner to allow MMIC 10 to operate as a power amplifier that has over a decade bandwidth and higher efficiency. More particularly, MMIC 10 incorporates dimensions of substrate 48 that allow significant power output and efficiency over wide bandwidths. For example, MMIC 10 covers 0.27 GHz to 2.7 GHz at a nominal power output of 65 watts with greater than fifty percent power added efficiency (PAE).

Figure 2:
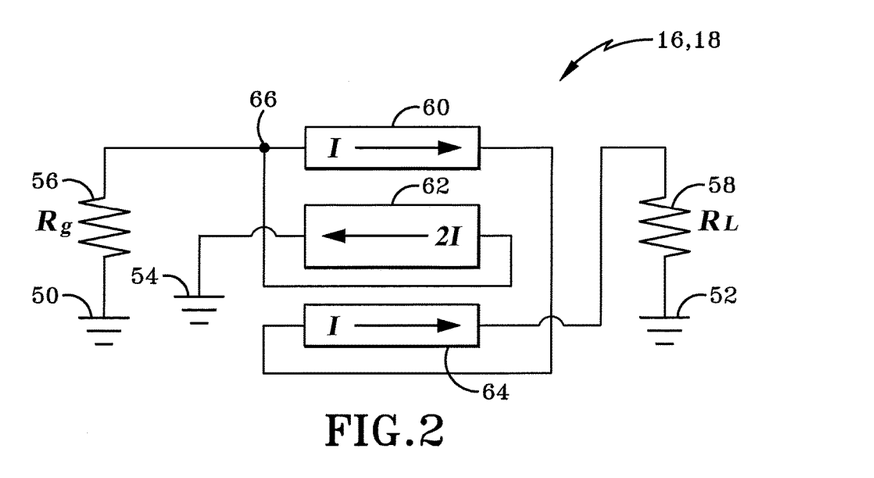
FIG. 2 is a schematic layout of a 9:1 overlay transformer in accordance with one aspect of the present disclosure.

FIG. 2 depicts a schematic representation of the first overlay transformer 16 and the second overlay transformer 18. The first overlay transformer 16 and the second overlay transformer may be embodied as a Ruthroff-type transformer or a Guanella-type transformer. According to this example first and second overlay transformers 16, 18 are schematically identical. Each overlay transformer includes an input 50, an output 52, and a ground 54. Furthermore, each overlay transformer includes a first resistor ($R_G$) 56, a second resistor ($R_L$) 58, a first transmission line 60, a second transmission line 62, and a third transmission line 64. Electrical signals flow from the input 50 to the output 52.

First resistor 56 is a low impedance resistor. The relationship of the first resistor 56 relative to the second resistor 58 is:

$$R_G = R_L \div 9 \quad \text{(Equation 1)}.$$

The first resistor 56 is positioned electrically down-current from input 50 and electrically up-current from the first transmission line 60, the second transmission line 62, and the third transmission line 64. The second resistor 58 is positioned electrically down-current from the first resistor 56, and electrically down-current from the first transmission line 60, the second transmission line 62, and the third transmission line 64. The second resistor 58 is positioned electrically up-current from the output 52.

The first transmission line 60 is electrically connected in series with the third transmission line 64. The first transmission line 60 is positioned serially up-current from the third transmission line 64. The second transmission line 62 is backwards coupled via backwards couple 66 which is located electrically up-current from the first transmission line 60.

The backwards coupled second transmission line 62 causes current to move in an opposite direction as indicated by the arrow in FIG. 2 through the second transmission line 62 towards ground 54. The current moving in the second transmission line 62 moves in a direction opposite that of the first transmission line 60 and the third transmission line 64. Moreover, the current moving through the second transmission line 62 is twice that moving through the first transmission line 60. Twice the amount of current moving through the second transmission line 62 is represented by 21 in FIG. 2.

In one exemplary and non-limiting embodiment, the overlay transformers 16, 18 reduce the driving point impedance to less than 10 ohms. In another example, the overlay transformers reduce the driving point impedance down from about 50 ohms to about 5.55 ohms. This is accomplished by the three overlaid transmission lines 60, 62, and 64 arranged in the manner described above providing a 9:1 ratio of output impedance to input impedance. Stated otherwise, the output impedance is a factor of nine greater than the first impedance at the input terminal.

Figure 3A:
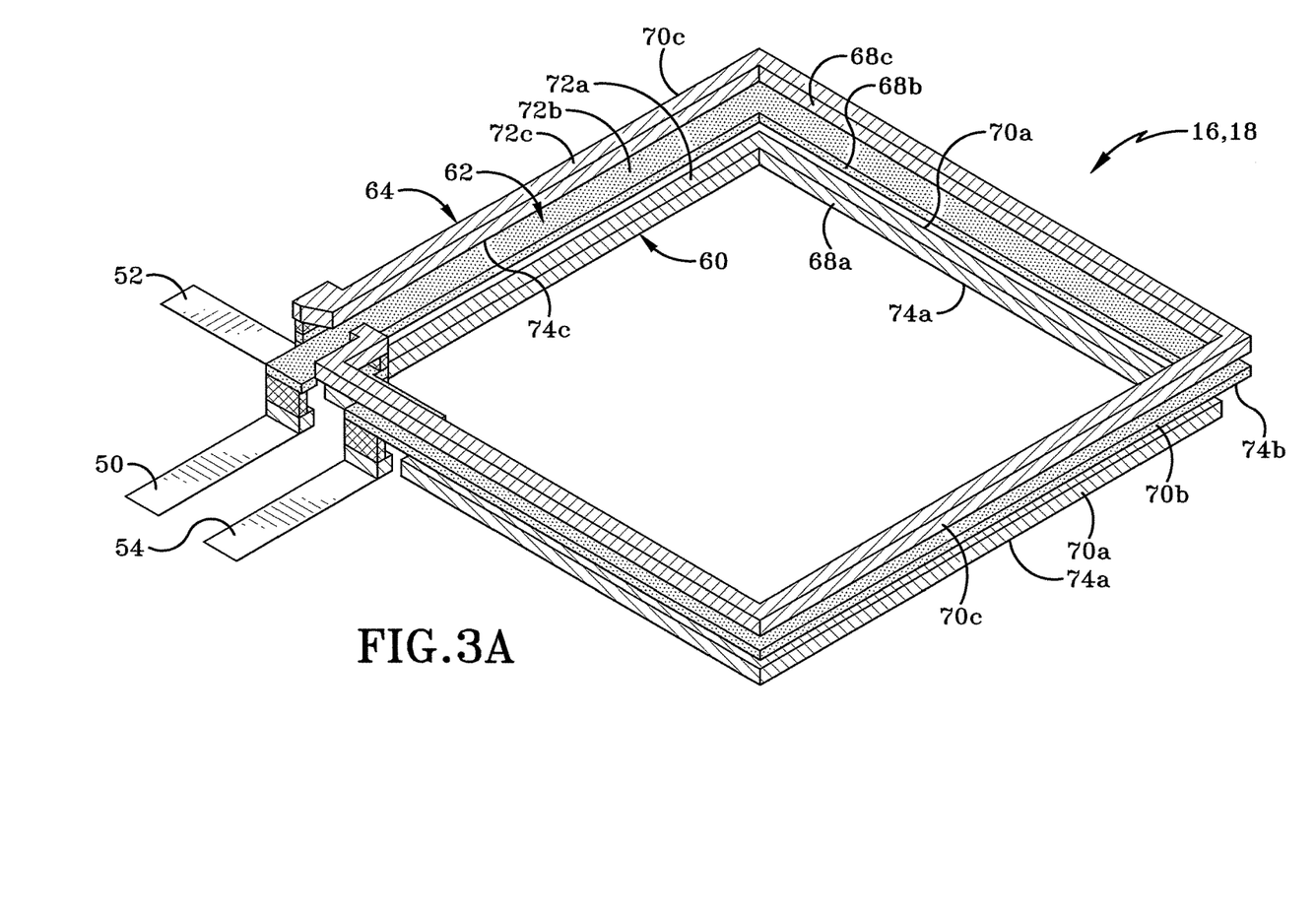
FIG. 3A is a top perspective view of an exemplary 9:1 overlay transformer.
Figure 3B:
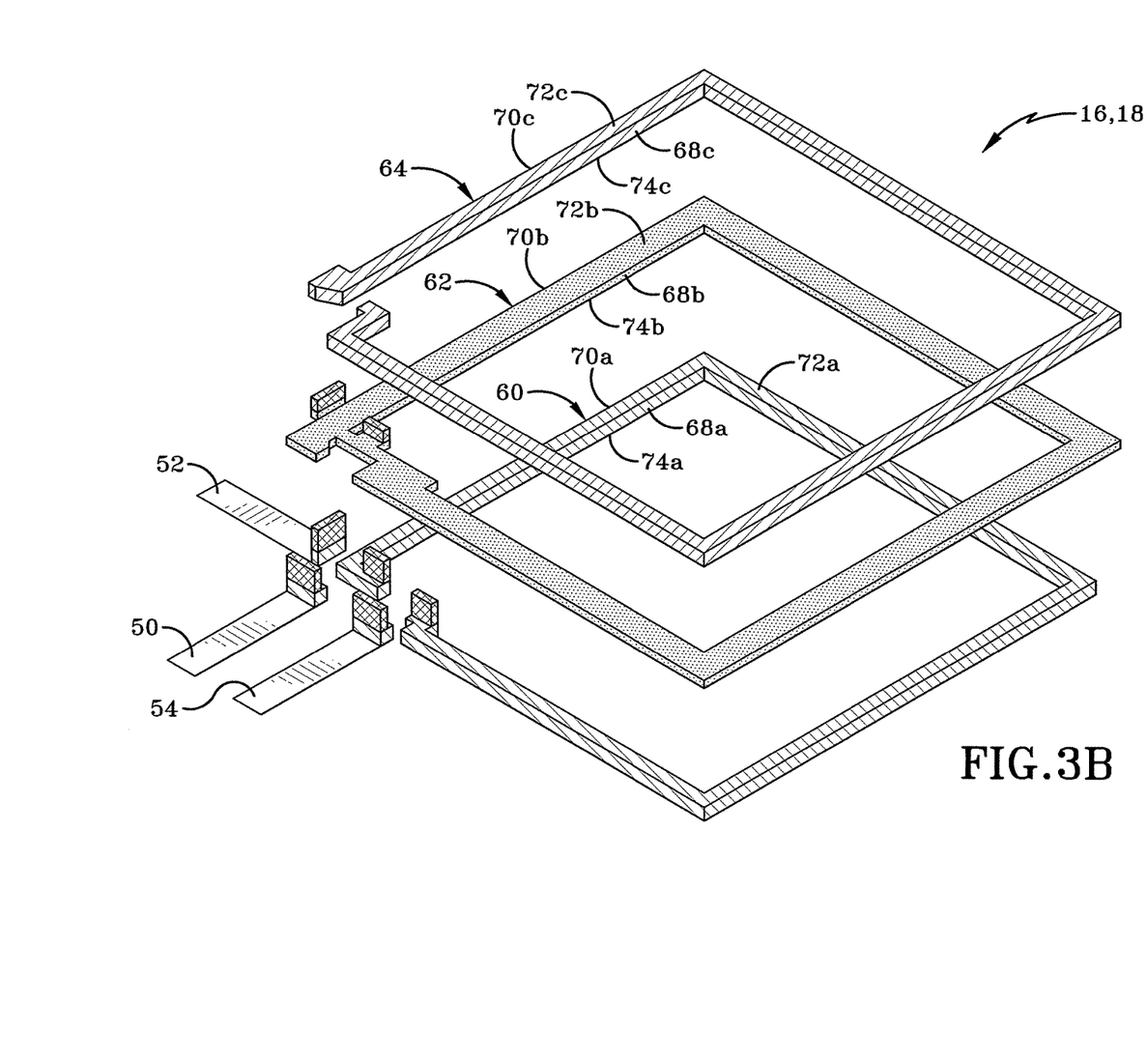
FIG. 3B is an exploded perspective view of the 9:1 overlay transformer.
Figure 4:
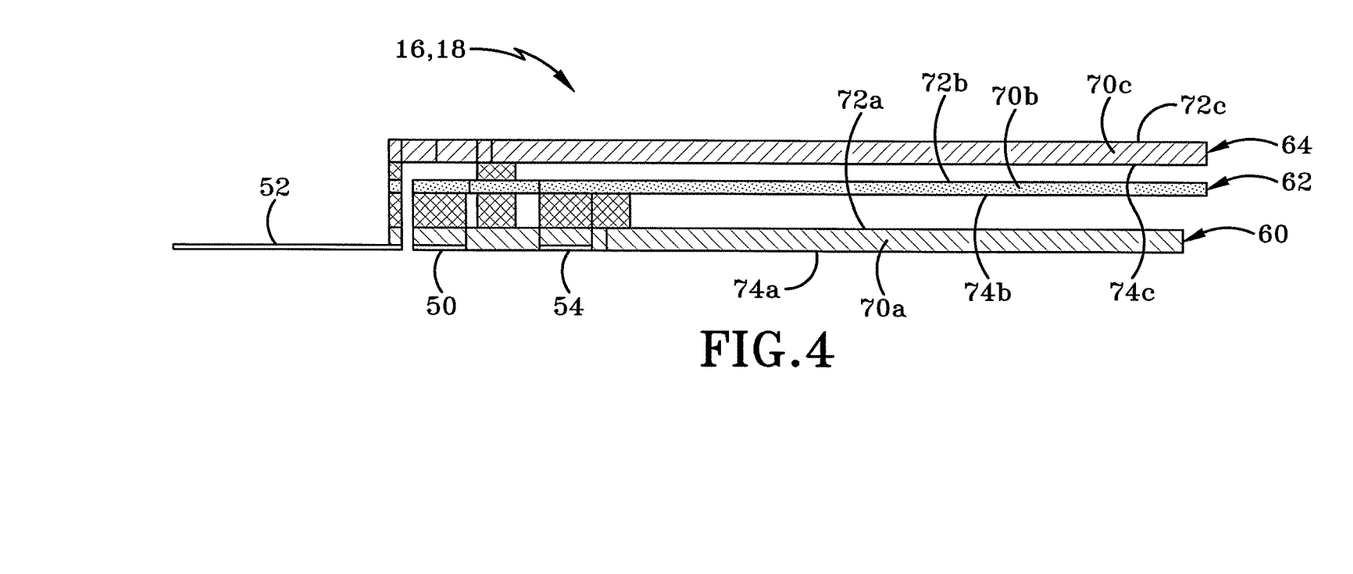
FIG. 4 is a side elevation view of the 9:1 overlay transformer.

As depicted in FIG. 3A, FIG. 3B, and FIG. 4, each transmission line 60, 62, and 64 includes a first edge surface, a second edge surface, an upwardly facing first broadside surface, and a downwardly facing broadside second surface. The broadside surfaces are defined between the first and second edges. With respect to the first transmission line 60, a first edge 68a is opposite a second edge 70a. The first upwardly facing broadside surface 72a is opposite the second downwardly facing broadside surface 74a. With respect to the second transmission line 62, it comprises first edge 68b, second edge 70b, upwardly facing first broadside surface 72b, and the second downwardly facing broadside surface 74b. With respect to the third transmission line 64, it comprises a first edge 68c, a second edge 70c, a upwardly facing first broadside surface 72c, and a downwardly facing second broadside surface 74c.

The transmission lines 60, 62, and 64 are broadside-coupled transmission lines of the overlay transformers 16, 18 implemented in MMIC 10. As such, when viewed from the side, as depicted in FIG. 4, the transmission lines are vertically stacked such that the broadside surfaces face each other. For example, first broadside surface 72a of first transmission line 60 faces downwardly facing second broadside surface 74b of the second transmission line 62. Further, the upwardly facing first broadside surface 72b of the second transmission line 62 is facing the downwardly facing second broadside surface 74c of the third transmission line 64. Stated otherwise, the second transmission line 62 is vertically sandwiched between the first transmission line 60 and third transmission line 64. In one exemplary embodiment, the third transmission line 64 is positioned at a vertical height above the second transmission line 62 which is above the first transmission line 60.

With continued reference to FIG. 4, it is seen that the transmission lines 60, 62, 64 that are vertically stacked relative to each other are spaced apart slightly so as to define a gap therebetween. In some implementations, the gap may be filled with nonconductive materials which are structurally supportive and insulative. In other embodiments, the gap defined between the spaced apart transmission lines that are broadside aligned may simply remain open.

The plurality of broadside-coupled transmission lines 60, 62, and 64 may provide a 9:1 impedance transformation between the output terminal 52 and the input terminal 50. For example, in one embodiment, the first impedance at the input terminal 50 may be about 5.55 ohms, and the second impedance at the output terminal 52 may be about 50 ohms. This may allow the RF power amplifier to drive a load with the first impedance, while presenting the second impedance to other components in the transmit chain (i.e., an antenna). The lower value of the first impedance may allow the RF power amplifier embodied as MMIC 10 to operate at a higher power. Additionally, the overlay transformers 16, 18 depicted in FIG. 3A, FIG. 3B, and FIG. 4 are shown generally in a square configuration. However, it is to be entirely understood that the transmission lines 60, 62, and 64 may be meandered in any design configuration to meet the specific needs of the application. For example, as depicted in FIG. 1, MMIC 10 includes overlay transformers 16, 18 with meandering transmission lines that are L-shaped when viewed from above. The L-shaped overlay transformers 16, 18 operate identically to that which is described in FIG. 2-FIG. 4, but are merely arranged to fit more closely and conserve space atop substrate 48 of MMIC 10.

Figure 5:
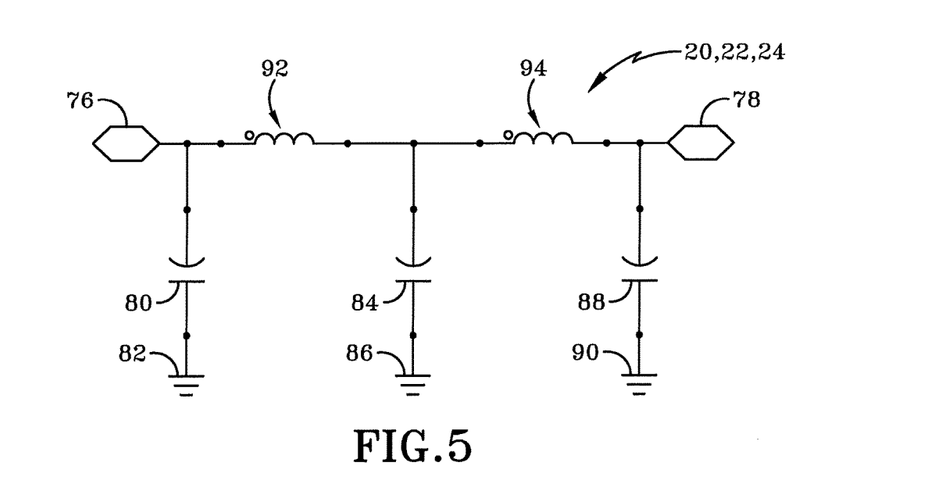
FIG. 5 is a schematic layout of an artificial low impedance transmission line in accordance with one aspect of the present disclosure.

FIG. 5 depicts a schematic representation of the artificial low impedance transmission lines 20, 22, and 24. Schematically, each of the transmission lines operates in a similar manner and includes an input 76, an output 78, a first shunt capacitor 80 connected to ground 82, a second shunt capacitor 84 connected to ground 86, and a third shunt capacitor 88 connected to ground 90. The artificial low impedance transmission lines 20, 22, and 24 further include sections of high impedance transmission lines that behave as inductors. For schematic purposes, the transmission lines that behave as inductors are shown schematically as inductors in FIG. 5, namely, at first inductor 92 and at second inductor 94. It is to be understood that the items behaving as inductors 92, 94 are not in fact actual inductors, rather they are high impedance transmission lines that behave as inductors. The high impedance transmission lines behaving as first inductor 92 and second inductor 94 are shown in FIG. 1 as well, being labeled as a first high impedance transmission line at 92 and a second high impedance transmission line at 94.

With respect to the schematic of FIG. 5, the topological configuration of the artificial low impedance transmission lines enables the MMIC 10 to be constructed in a manner that reduces space on the substrate 48. This configuration reduces the space occupied upon the substrate 48 by replacing wide and long low impedance transmission lines by a structure of shunt capacitors and series inductors realized by narrow (for example, the term narrow may refer to less than 0.1 mm width) transmission lines. However, it is to be understood that the transmission lines 92, 94 that behave as inductors occupy significantly less space. Thus, the term "artificial" as used herein refers to transmission lines that are low impedance because they behave like wide (i.e., wide refers to 1 mm or greater) and long (i.e., long refers to 10 mm or greater) low impedance transmission lines, but are physically constructed as shunt capacitors and narrow (about 0.1 mm) high impedance transmission lines.

Figure 6:
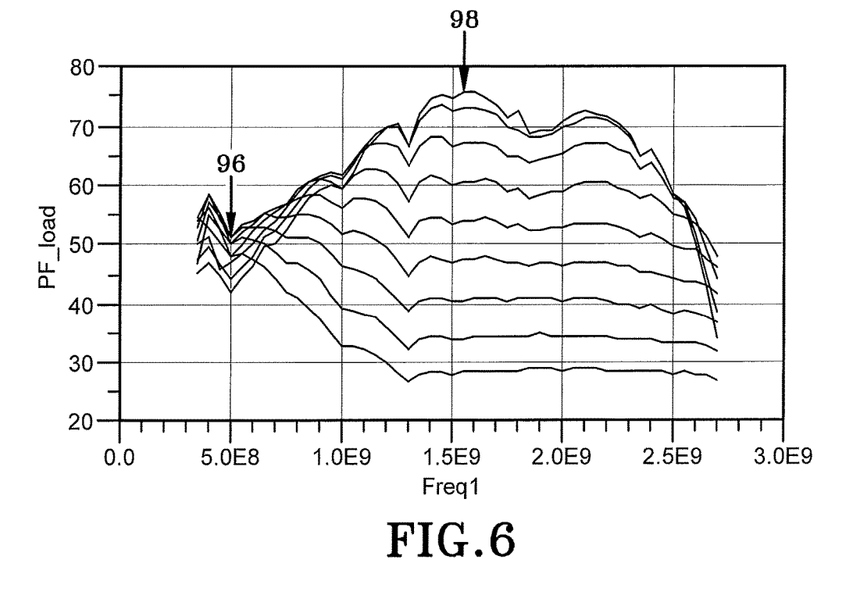
FIG. 6 is a graph depicting output power (y-axis) versus bandwidth frequency of signals (x-axis) moving through the integrated circuit.

FIG. 6 depicts a graph identifying power output along the y-axis and signal frequency along the x-axis and is configured as described above as having a minimum power output of 51.5 watts indicated at point 96 in FIG. 6 and has a maximum power output of 75.6 watts indicated at point 98 in FIG. 6. The signal frequency is in a range from 0.5 GHz to 2.5 GHz as indicated by 5E8 and 2.5E9 along the x-axis.

Figure 7:
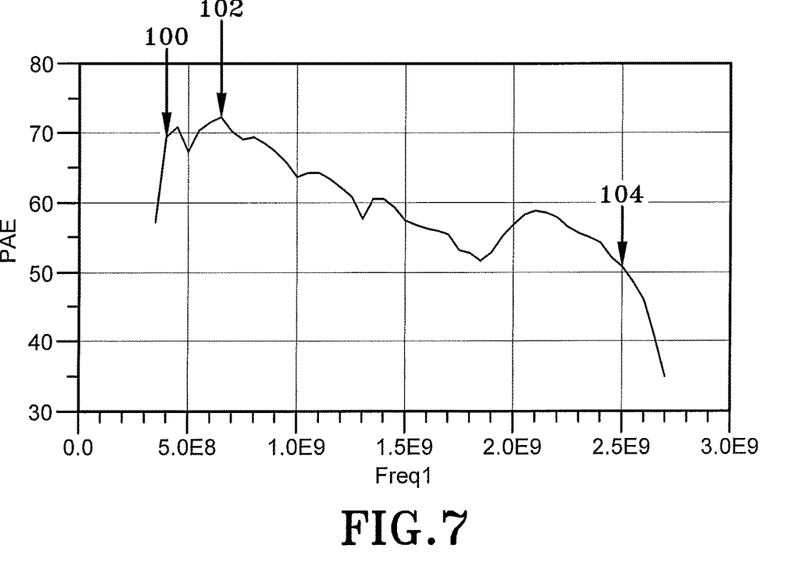
FIG. 7 is a graph depicting power added efficiency (y-axis) versus bandwidth frequency of signals (x-axis) moving through the integrated circuit.

As depicted in FIG. 7, a similar frequency range is depicted along the x-axis in a range from zero to 3 GHz, wherein 0.5 GHz is represented by 5E8 and 2.5 GHz is represented by 2.5E9. The y-axis indicates power added efficiency (PAE) ranging from 30 to 80. At point 100, the power added efficiency is about 69.5 for a frequency of 0.4 GHz. For a frequency of 0.65 GHz, the power added efficiency is about 72.4 which is indicated at point 102. At point 104, for a frequency of 2.5 GHZ, the power added efficiency is about 50.7. One having ordinary skill in the art recognizes that these are unprecedented levels of microwave frequency performance in power output, power added efficiency, and bandwidth achieved using MMIC circuit implementations.

In accordance with an aspect of the present disclosure, MMIC 10 is implemented as a power amplifier having a low loss 9:1 Overlay transformer and artificial low impedance transmission lines. This technique is an improvement over previous conventional MMICs that utilize distributed structures to match the very low input and output impedances. The dimensions of the conventional distributed structures are physically unrealizable (i.e., they are not possible to build). MMIC 10 of the present disclosure allows for the realization of unprecedented power output and efficiency (as best proven in FIG. 6 and FIG. 7) over wide bandwidths. The exemplary MMIC 10 covers a decade bandwidth from about 0.27 GHz to about 2.7 GHz at a nominal power output of 65 watts with greater than fifty percent power added efficiency (PAE). In various embodiments, one having ordinary skill in the art will recognize that the power amplifier design process utilizing MMIC 10 begins with the output impedance matching network. This network provides a high current drain voltage bias to the amplifying device. In one particular embodiment, this may be a GaN HEMT. The amplifying device matched the optimum load of the chosen transistor periphery to 50 ohms with low loss. The optimum load impedance is very low. In one particular embodiment, the transistor periphery is 25.6 mm and a resistance of approximately 4.6 ohms is shunted by a large parasitic capacitance. The input matching network provides gate bias to the amplifying device and matches the very low impedance of the gate to 50 ohms to obtain gain from the transistor. One having ordinary skill in the art recognizes that conventional techniques in very wide (greater than one 1 mm) and very long (about 14 mm) transmission lines that cannot be physically constructed (i.e., they would have impossible bends, or must connect multiple cells, or are too large for the wafer reticle).

In one example associated with MMIC 10, a 25.6 mm periphery of the 0.2 µm gate length no field plate GaN HEMT is composed of four 6.4 mm cells. Each 6.4 mm cell utilizes eight 2×400 µm gate width sub-cells with individual backside slot vias. Odd-mode suppression/balance resistors are incorporated between cells. Drain bias is introduced using an octagonal approximation to a spiral inductor. Full metal thickness 9.4 µm to handle the five amp quiescent current draw. Impedance matching at both input and output use a meandered 9:1 overlay transformer reducing the driving point impedance of 50 ohms to 5 ohms. Wide low impedance transmission lines are necessary for the multi-section matching networks required to achieve wide bandwidth. They are realized utilizing the artificial low impedance transmission lines 20, 22, and 24, which are shown schematically in FIG. 5. The periodic structure is symmetric using identical shunt capacitors and inductors realized by high impedance transmission lines. This structure can be meandered and scaled in dimensions to interconnect points in the hierarchal matching networks.

An embodiment is an implementation or example of the present disclosure. Reference in the specification to "an embodiment," "one embodiment," "some embodiments," "one particular embodiment," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration set out herein are an example and the invention is not limited to the exact details shown or described.

What is claimed is:

1. A monolithic microwave integrated circuit (MMIC) power amplifier comprising:
    a substrate;
    an input port supported by the substrate and an output port supported by the substrate, wherein the input port is indirectly electrically coupled to the output port; a first overlay transformer supported by the substrate and electrically intermediate the input port and the output port for transforming impedance from a higher input impedance to a lower output impedance; and
    a first artificial low impedance transmission line supported by the substrate that is electrically intermediate the input port and the output port, and in electrical communication with the first overlay transformer, wherein the first artificial low impedance transmission line is coupled with at least one shunt capacitor and at least one high impedance transmission line configured as an inductor to provide artificial low impedance to electrical signals flowing through the first low impedance transmission line from the input port to the output port.

2. The MMIC power amplifier of claim 1, further comprising:
    a power transistor supported by the substrate and electrically intermediate the input port and the output port;
    wherein the first artificial low impedance transmission line is positioned up-current from the power transistor.

3. The MMIC power amplifier of claim 1, wherein the first Overlay transformer is positioned up-current from the first artificial low impedance transmission line.

4. The MMIC power amplifier of claim 1, further comprising:
    a second artificial low impedance transmission line supported by the substrate that is electrically intermediate the input port and the output port and positioned down-current from the first artificial low impedance transmission line for performing as an inductor to provide artificial low impedance to electrical signals flowing as current through the second low impedance transmission line; and
    a third artificial low impedance transmission line supported by the substrate that is electrically intermediate the input port and the output port and positioned down-current from the first artificial low impedance transmission line for performing as an inductor to provide artificial low impedance to electrical signals flowing as current through the second low impedance transmission line.

5. The MMIC power amplifier of claim 4, wherein the second artificial low impedance transmission line is electrically connected parallel with the third artificial low impedance transmission line.

6. The MMIC power amplifier of claim 5, further comprising:
    a second overlay transformer supported by the substrate and electrically intermediate the input port and the output port for transforming impedance from a higher input impedance to a lower output impedance;
    wherein the second overlay transformer is electrically down-current from the second artificial low impedance transmission line and the third artificial low impedance transmission line.

7. The MMIC power amplifier of claim 6, further comprising:
    a first ratio of the higher input impedance to the lower output impedance of the first overlay transformer of 9:1; and
    a second ratio of the higher input impedance to the lower output impedance of the second overlay transformer of 9:1.

8. The MMIC power amplifier of claim 1, wherein the higher input impedance of the first overlay transformer is at least nine times greater than the lower output impedance.

9. The MMIC power amplifier of claim 1, wherein the artificial low impedance provided by the first artificial low impedance transmission line is less than 10 ohms.

10. The MMIC power amplifier of claim 1, wherein the artificial low impedance provided by the first artificial low impedance transmission line is about 5.55 ohms.

11. The MMIC power amplifier of claim 1, wherein the first overlay transformer includes at least three broadside-coupled transmission lines.

\* \* \* \* \*